US010651527B2

(12) United States Patent
Mohan

(10) Patent No.: US 10,651,527 B2
(45) Date of Patent: May 12, 2020

(54) SPATIAL POWER-COMBINING DEVICES WITH SEGMENTED WAVEGUIDES AND ANTENNAS

(71) Applicant: Qorvo US, Inc., Greensboro, NC (US)

(72) Inventor: Ankush Mohan, Thousand Oaks, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/981,535

(22) Filed: May 16, 2018

(65) Prior Publication Data

US 2019/0067778 A1 Feb. 28, 2019

Related U.S. Application Data

(60) Provisional application No. 62/548,464, filed on Aug. 22, 2017.

(51) Int. Cl.
*H01P 5/08* (2006.01)
*H03F 3/195* (2006.01)
(Continued)

(52) U.S. Cl.
CPC ............... *H01P 5/08* (2013.01); *H01P 5/12* (2013.01); *H01Q 1/48* (2013.01); *H01Q 1/50* (2013.01);
(Continued)

(58) Field of Classification Search
CPC .... H01P 5/08; H01P 5/12; H01Q 1/48; H01Q 1/50; H01Q 13/085; H03F 3/195; H03F 3/213; H03F 2200/255; H04B 2001/0408
(Continued)

(56) References Cited

U.S. PATENT DOCUMENTS 3,023,382 A 2/1962 Borghetti
4,234,854 A 11/1980 Schellenberg et al.
(Continued)

OTHER PUBLICATIONS

Author Unknown, "Interpack 2005: An assessment for PMMI members," 2005, PMMI, 32 pages.
(Continued)

*Primary Examiner* — Robert J Pascal
*Assistant Examiner* — Kimberly E Glenn
(74) *Attorney, Agent, or Firm* — Withrow & Terranova, P.L.L.C.

(57) ABSTRACT

Spatial power-combining devices and antenna assemblies for spatial power-combining devices are disclosed. The disclosure relates to spatial power-combining devices with segmented waveguides and antennas. The spatial power-combining devices may be designed for high efficiency, high or low frequency ranges, ultra-wide bandwidth operation, and high output power. A spatial power-combining device may include a plurality of amplifiers, an output center waveguide including an output inner housing and an output outer housing, and an output coaxial waveguide. The output center waveguide may form a plurality of output center waveguide segments that are discontinuous with each other. Each output center waveguide segment may include a different portion of the output inner housing and the output outer housing. An antenna for a spatial power-combining device may include a plurality of antenna segments, each of which includes a different portion of a signal conductor and a ground conductor of the antenna.

20 Claims, 11 Drawing Sheets

(51) Int. Cl.
*H03F 3/213* (2006.01)
*H01Q 1/50* (2006.01)
*H01Q 1/48* (2006.01)
*H01P 5/12* (2006.01)
*H01Q 13/08* (2006.01)
*H04B 1/04* (2006.01)

(52) U.S. Cl.
CPC ........... *H01Q 13/085* (2013.01); *H03F 3/195* (2013.01); *H03F 3/213* (2013.01); *H03F 2200/255* (2013.01); *H04B 2001/0408* (2013.01)

(58) Field of Classification Search
USPC .................................................. 333/127
See application file for complete search history.

(56) References Cited

U.S. PATENT DOCUMENTS

| | | | |
|---|---|---|---|
| 4,424,496 | A | 1/1984 | Nichols et al. |
| 5,036,335 | A | 7/1991 | Jairam |
| 5,181,221 | A | 1/1993 | Mori et al. |
| 5,214,394 | A | 5/1993 | Wong |
| 5,256,988 | A | 10/1993 | Izadian |
| 5,736,908 | A | 4/1998 | Alexanian et al. |
| 5,920,240 | A | 7/1999 | Alexanian et al. |
| 6,028,483 | A | 2/2000 | Shealy et al. |
| 6,037,840 | A | 3/2000 | Myer |
| 6,828,875 | B2 | 12/2004 | Channabasappa et al. |
| 7,110,165 | B2 | 9/2006 | Martin et al. |
| 7,215,220 | B1 | 5/2007 | Jia |
| 7,466,203 | B2 | 12/2008 | Rector |
| 8,698,577 | B2 | 4/2014 | Sherrer et al. |
| 8,928,429 | B2 | 1/2015 | Song et al. |
| 9,019,036 | B2 | 4/2015 | Kolias et al. |
| 9,054,427 | B2 | 6/2015 | Guy et al. |
| 9,065,163 | B1 | 6/2015 | Wu et al. |
| 9,276,304 | B2 | 3/2016 | Behan et al. |
| 9,287,605 | B2 | 3/2016 | Daughenbaugh, Jr. et al. |
| 9,325,074 | B2 | 4/2016 | Chandler |
| 9,917,343 | B2 | 3/2018 | Chieh et al. |
| 9,954,706 | B1 | 4/2018 | Harris et al. |
| 10,003,118 | B2 | 6/2018 | Kitt |
| 10,009,067 | B2 | 6/2018 | Birk et al. |
| 10,164,667 | B1 | 12/2018 | Kitt |
| 2006/0202777 | A1 | 9/2006 | Deckman et al. |
| 2007/0229186 | A1 | 10/2007 | Hacker et al. |
| 2007/0279146 | A1 | 12/2007 | Rector |
| 2014/0145794 | A1 | 5/2014 | Courtney et al. |
| 2014/0167880 | A1 | 6/2014 | Daughenbaugh, Jr. et al. |
| 2017/0149113 | A1 | 5/2017 | Theveneau et al. |
| 2017/0179598 | A1 | 6/2017 | Kitt |
| 2018/0294539 | A1 | 10/2018 | Kitt |
| 2019/0007007 | A1 | 1/2019 | Kitt |
| 2019/0067781 | A1 | 2/2019 | Mohan et al. |
| 2019/0067782 | A1 | 2/2019 | Mohan et al. |
| 2019/0067783 | A1 | 2/2019 | Mohan et al. |
| 2019/0067836 | A1 | 2/2019 | Mohan |
| 2019/0068123 | A1 | 2/2019 | Mohan et al. |
| 2019/0068140 | A1 | 2/2019 | Mohan et al. |
| 2019/0068141 | A1 | 2/2019 | Yoon et al. |

OTHER PUBLICATIONS

Caturla, F., et al., "Electroless Plating of Graphite with Copper and Nickel," Journal of the Electrochemical Soceity, vol. 142, Issue 12, Dec. 1995, The Electrochemical Society, Inc., pp. 4084-4090.
Fitzhugh, William, et al., "Modulation of Ionic Current Limitations by Doping Graphite Anodes," Journal of Electrochemical Society, vol. 165, Issue 10, Jul. 2018, The Electrochemical Society, 6 pages.
Larkins, Grover, et al., "Evidence of Superconductivity in Doped Graphite and Graphene," Superconductor Science and Technology, vol. 29, Issue 1, Dec. 2015, IOP Publishing Ltd, 18 pages.
Glenis, S., et al., "Sulfur doped graphite prepared via arc discharge of carbon rods in the presence of thiopenes," Journal of Applied Physics, vol. 86, Issue 8, Oct. 1999, American Institute of Physics, pp. 4464-4466.
Scheike, T., et al., "Can doping graphite trigger room temperature superconductivity: Evidence for granular high-temperature superconductivity in water-treated graphite powder," Advanced Materials, vol. 24, Issue 43, Sep. 2012, 19 pages.
Smalc, Martin, et al., "Thermal Performance of Natural Graphite Heat Spreaders," Proceedings of IPACK2005, Jul. 17-22, San Francisco, California, American Society of Mechanical Engineers, 11 pages.
Notice of Allowance for U.S. Appl. No. 15/637,472, dated Mar. 12, 2019, 7 pages.
Non-Final Office Action for U.S. Appl. No. 15/846,840, dated Mar. 21, 2019, 4 pages.
Notice of Allowance for U.S. Appl. No. 15/845,225, dated Jan. 10, 2019, 7 pages.
Notice of Allowance for U.S. Appl. No. 16/166,548, dated Nov. 29, 2018, 8 pages.
Non-Final Office Action for U.S. Appl. No. 15/637,472, dated Aug. 10, 2018, 8 pages.
Notice of Allowance for U.S. Appl. No. 15/927,565, dated Aug. 8, 2018, 8 pages.
Author Unknown, "Spatial Combining Technology: Revolutionizing the Microwave Power Amplifier," Microwave Journal, Sep. 8, 2008, http://www.microwavejournal.com/articles/print/6838-spatial-combining, CAP Wireless Inc., 7 pages.
Author Unknown, "Vivaldi antenna," Wikipedia, web page last edited Feb. 7, 2017, accessed May 11, 2017, https://en.wikipedia.org/wiki/Vivaldi_antenna, Wikimedia Foundation, Inc., 2 pages.
Courtney, Patrick G. et al., "120 W Ka Band Power Amplifier Utilizing GaN MMICs and Coaxial Waveguide Spatial Power Combining," White Paper, May 2016, Qorvo, pp. 1-8.
Jia, Pengcheng et al., "Broadband High Power Amplifier using Spatial Power Combining Technique" IEEE Transactions on Microwave Theory and Techniques, vol. 51, Issue 12, Dec. 2003, IEEE, 4 pages.
Leggieri, Alberto et al., "The Squarax Spatial Power Combiner," Progress in Electromagnetics Research C, vol. 45, Oct. 2013, EMW Publishing, pp. 43-55.
Ortiz, Sean C., "High Power Spatial Combiners: Tile and Tray Approaches," Dissertation, North Carolina State University, Electrical Engineering, Nov. 2001, 194 pages.
Notice of Allowance for U.S. Appl. No. 15/290,749, dated Feb. 16, 2018, 9 pages.
Amjadi, S., et al., "Design of a Broadband Eight-Way Coaxial Wavelength Power Combiner," IEEE Transactions on Microwave Theory and Techniques, vol. 60, Issue 1, Nov. 15, 2011, pp. 39-45.
Beyers, R., et al., "Compact Conical-Line Power Combiner Design Using Circuit Models," IEEE Transactions on Microwave Theory and Techniques, vol. 62, Issue 11, Oct. 9, 2014, pp. 2650-2658.
Fathy, A., et al., "A Simplified Approach for Radial Power Combiners," IEEE Transactions on Microwave Theory and Techniques, vol. 54, No. 1, Jan. 2006, pp. 247-255.
Gharehkand, F., "Design of a 16 Way Radial Microwave Power Divider/Combiner with Rectangular Waveguide Output and Coaxial Inputs," International Journal of Electronics and Communications (AEU), vol. 68, 2014, pp. 422-428.
Tribak, A., et al., "Ultra-Broadband High Efficiency Mode Converter," Progress in Electromagnetics Research C, vol. 36, 2013, pp. 145-158.
Montgomery, R., et al., "Solid-State PAs Bathe TWTAs for ECM Systems," Microwave Journal, Jun. 2017 Supplement, Jun. 14, 2017, 3 pages.
Mottonen, V. S., "Receiver Front-End Circuits and Components for Millimetre and Submillimetre Wavelengths," Dissertation for the degree of Doctor of Science in Technology, Helsinki University of Technology, Department of Electrical and Communications Engineering, Radio Laboratory, Apr. 2005, 40 pages.
Non-Final Office Action for U.S. Appl. No. 15/933,783, dated May 1, 2019, 8 pages.

(56) References Cited

OTHER PUBLICATIONS

Non-Final Office Action for U.S. Appl. No. 16/042,351, dated Jul. 5, 2019, 5 pages.
Notice of Allowance for U.S. Appl. No. 15/846,840, dated Jul. 5, 2019, 7 pages.
Non-Final Office Action for U.S. Appl. No. 15/933,821, dated Jul. 11, 2019, 7 pages.
Non-Final Office Action for U.S. Appl. No. 15/981,516, dated Jul. 17, 2019, 5 pages.
Non-Final Office Action for U.S. Appl. No. 16/005,794, dated Oct. 7, 2019, 11 pages.
Notice of Allowance for U.S. Appl. No. 16/042,351, dated Nov. 18, 2019, 7 pages.
Non-Final Office Action for U.S. Appl. No. 16/008,586, dated Oct. 24, 2019, 10 pages.
Non-Final Office Action for U.S. Appl. No. 16/191,541, dated Dec. 9, 2019, 7 pages.
Corrected Notice of Allowance and Examiner-Initiated Interview Summary for U.S. Appl. No. 15/846,840, dated Dec. 12, 2019, 6 pages.
Notice of Allowance for U.S. Appl. No. 16/005,794, dated Jan. 9, 2020, 7 pages.
Non-Final Office Action for U.S. Appl. No. 16/032,252, dated Dec. 27, 2019, 5 pages.
Notice of Allowance for U.S. Appl. No. 16/008,586, dated Feb. 4, 2020, 8 pages.
Corrected Notice of Allowance and Applicant-Initiated Interview Summary for U.S. Appl. No. 15/846,840, dated Dec. 31, 2019, 6 pages.
Notice of Allowance for U.S. Appl. No. 15/933,821, dated Jan. 15, 2020, 7 pages.
Non-Final Office Action for U.S. Appl. No. 16/039,435, dated Jan. 7, 2020, 5 pages.
Notice of Allowance for U.S. Appl. No. 15/981,516, dated Jan. 15, 2020, 7 pages.

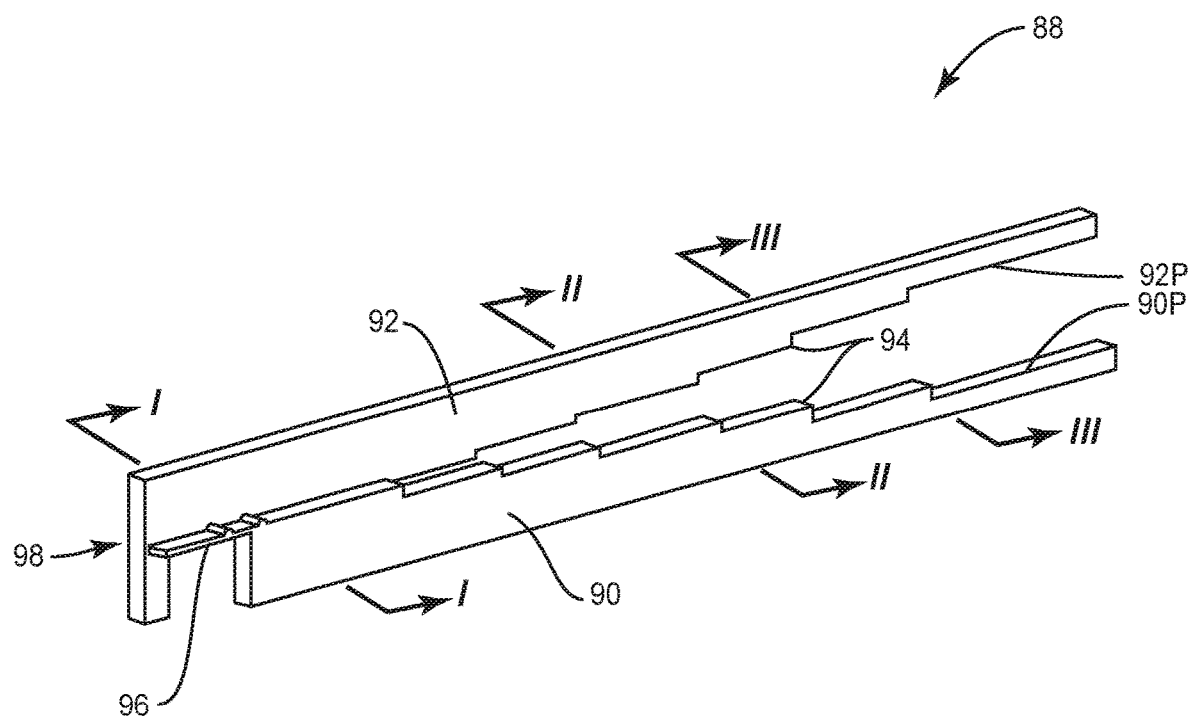
FIG. 7A
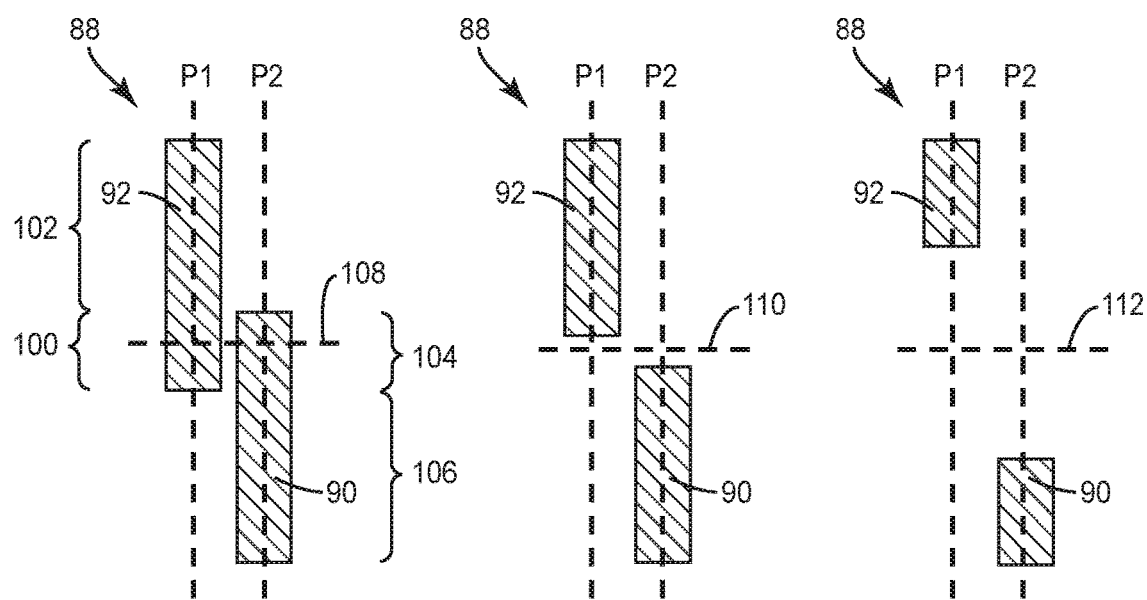
FIG. 7B  FIG. 7C  FIG. 7D

SPATIAL POWER-COMBINING DEVICES WITH SEGMENTED WAVEGUIDES AND ANTENNAS

RELATED APPLICATION

This application claims the benefit of provisional patent application Ser. No. 62/548,464, filed Aug. 22, 2017, the disclosure of which is hereby incorporated herein by reference in its entirety.

FIELD OF THE DISCLOSURE

The disclosure relates generally to spatial power-combining devices, and more particularly, to spatial power-combining devices with segmented waveguides and antennas.

BACKGROUND

Spatial power-combining devices, such as a Qorvo® Spatium® spatial power-combining device, are used for broadband radio frequency power amplification in commercial and defense communications, radar, electronic warfare, satellite, and various other communication systems. Spatial power-combining techniques are implemented by combining broadband signals from a number of amplifiers to provide output powers with high efficiencies and operating frequencies. One example of a spatial power-combining device utilizes a plurality of solid-state amplifier assemblies that form a coaxial waveguide to amplify an electromagnetic signal. Each amplifier assembly may include an input antenna structure, an amplifier, and an output antenna structure. When the amplifier assemblies are combined to form the coaxial waveguide, input antennas may form an input antipodal antenna array, and output antennas may form an output antipodal antenna array.

In operation, an electromagnetic signal is passed through an input port to an input coaxial waveguide section of the spatial power-combining device. The input coaxial waveguide section distributes the electromagnetic signal to be split across the input antipodal antenna array. The amplifiers receive the split signals and in turn transmit amplified split signals across the output antipodal antenna array. The output antipodal antenna array and an output coaxial waveguide section combine the amplified split signals to form an amplified electromagnetic signal that is passed to an output port of the spatial power-combining device.

An antenna for conventional spatial power-combining devices typically includes a metal antenna signal conductor and a metal antenna ground conductor deposited on opposite sides of a substrate, such as a printed circuit board. The printed circuit board provides a desired form factor and mechanical support for the antenna signal conductor and the antenna ground conductor; however, the printed circuit board can become increasingly lossy at higher frequencies, thereby limiting combining efficiency, operating frequency range, and achievable output power of the spatial power-combining device.

SUMMARY

Aspects disclosed herein include spatial power-combining devices and antenna assemblies for spatial power-combining devices. The disclosure relates to spatial power-combining devices with segmented waveguides and antennas. The spatial power-combining devices may be designed for high efficiency, high or low frequency ranges, ultra-wide bandwidth operation, and high output power.

In some aspects, a spatial power-combining device includes a plurality of amplifiers, an output center waveguide section configured to concurrently receive amplified signals from the plurality of amplifiers, wherein the output center waveguide section comprises an output inner housing and an output outer housing, and an output coaxial waveguide section configured to receive the amplified signals from the output center waveguide section. The output center waveguide section forms a plurality of output center waveguide segments that are discontinuous with each other, and each output center waveguide segment of the plurality of output center waveguide segments comprises a different portion of the output inner housing and a different portion of the output outer housing. In some embodiments, the output inner housing comprises a plurality of output signal conductors and the output outer housing comprises a plurality of output ground conductors that may form an output antenna assembly. In some embodiments, each output center waveguide segment of the plurality of output center waveguide segments comprises a different portion of the plurality of output ground conductors and a different portion of the plurality of output signal conductors. In some embodiments, a plurality of output inner housing segments are mechanically attached to each other to form the output inner housing and a plurality of output outer housing segments are mechanically attached to each other to form the output inner housing.

In some embodiments, the spatial power-combining device further includes an input center waveguide section configured to concurrently guide an input signal to the plurality of amplifiers, wherein the input center waveguide section comprises an input inner housing and an input outer housing. The input center waveguide section forms a plurality of input center waveguide segments that are discontinuous with each other, wherein each input center waveguide segment of the plurality of input center waveguide segments comprises a different portion of the input inner housing and a different portion of the input outer housing. In some embodiments, the input coaxial waveguide section is configured to guide the input signal to the input center waveguide section.

In some embodiments, the output center waveguide section, the output coaxial waveguide section, the input center waveguide section and the input coaxial waveguide section may be formed completely of metal. The plurality of amplifiers may include a plurality of Monolithic Microwave Integrated Circuit (MMIC) amplifiers.

In some aspects, an antenna for a spatial power-combining device includes a signal conductor, a ground conductor; and a plurality of antenna segments that are discontinuous with each other. Each antenna segment of the plurality of antenna segments comprises a different portion of the signal conductor and a different portion of the ground conductor. In some embodiments, the plurality of antenna segments includes a first antenna segment and a second antenna segment, wherein the signal conductor and the ground conductor are spaced farther apart from each other in the first antenna segment than in the second antenna segment. The signal conductor and the ground conductor may be formed completely of metal and may be entirely separated from each other by air. In some embodiments, the first antenna segment of the plurality of antenna segments comprises a first tuning feature and the second antenna segment of the plurality of antenna segments comprises a second tuning feature.

Those skilled in the art will appreciate the scope of the present disclosure and realize additional aspects thereof after reading the following detailed description of the preferred embodiments in association with the accompanying drawing figures.

BRIEF DESCRIPTION OF TH DRAWING FIGURES

The accompanying drawing figures incorporated in and forming a part of this specification illustrate several aspects of the disclosure, and together with the description serve to explain the principles of the disclosure.

FIG. 7A is a perspective view of an antenna structure according to some embodiments.

FIG. 7B is a cross-sectional view of the antenna structure of FIG. 7A.

FIG. 7C is a cross-sectional view of the antenna structure of FIG. 7A.

FIG. 7D is a cross-sectional view of the antenna structure of FIG. 7A.

DETAILED DESCRIPTION

Figure 1A:
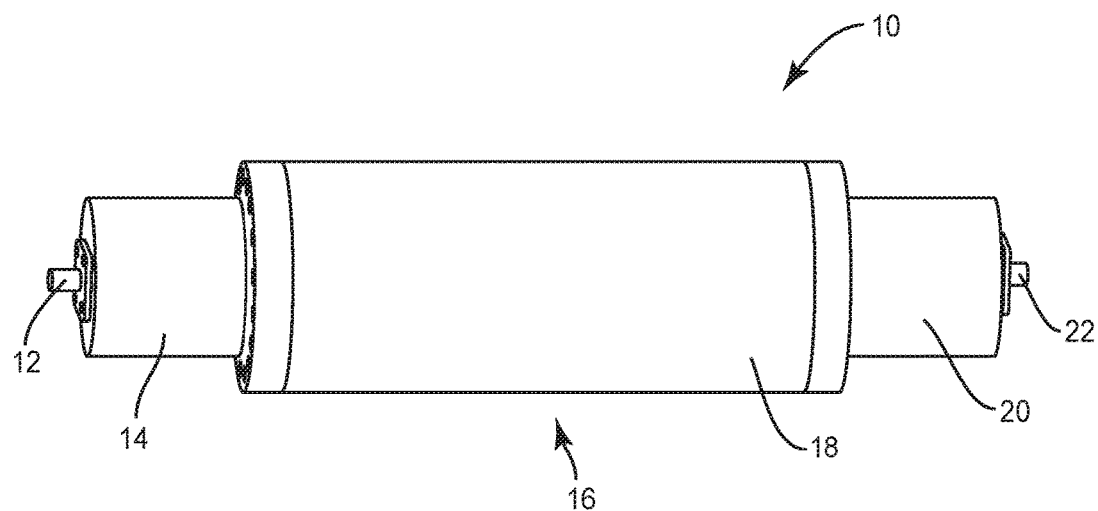
FIG. 1A is a perspective view of a spatial power-combining device according to some embodiments.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed herein include spatial power-combining devices and antenna assemblies for spatial power-combining devices. The disclosure relates to spatial power-combining devices with segmented waveguides and antennas. The spatial power-combining devices may be designed for high efficiency, high or low frequency ranges, ultra-wide bandwidth operation, and high output power.

In some embodiments, an antenna assembly may include a signal conductor and a ground conductor that are entirely separated by air. Conventional antenna structures for spatial power-combining devices typically have antenna conductors in the form of patterned metals on opposing sides of a printed circuit board. Separating the antenna conductors entirely by air eliminates any lossy materials of the printed circuit board and, among other advantages, facilitates spatial power-combining devices with antenna structures sized for ultra-broadband microwave operation. The embodiments are particularly adapted to spatial power-combining devices that operate at microwave frequencies, such as, by way of non-limiting example, energy between about 300 megahertz (MHz) and 300 gigahertz (GHz) (0.1 cm wavelength). A spatial power-combining device may operate within one or more common radar bands including, but not limited to, S-band, C-band, X-band, Ku-band, K-band, Ka-band, and Q-band. In some embodiments, by way of non-limiting examples, the operating frequency range includes an operating bandwidth spread of 2 GHz to 20 GHz. In other embodiments, the operating frequency range includes an operating bandwidth spread of 4 GHz to 41 GHz. In still further embodiments, the operating frequency range includes frequencies of 40 GHz and higher, such as operating frequency ranges of 2 GHz to 400 GHz, 20 GHz to 120 GHz, 40 GHz to 400 GHz, and 70 GHz to 400 GHz. Accordingly, an antenna assembly as described herein may be configured to transmit electromagnetic signals above, below, and within a microwave frequency range. For example, in various embodiments, an antenna assembly may transmit electromagnetic signals with frequencies as low as 100 MHz and as high as 400 GHz.

A spatial power-combining device generally includes a plurality of signal paths that include an amplifier connected to an output antenna structure of an output center waveguide. The output antenna structure may comprise an output antenna ground conductor and an output antenna signal conductor that are entirely separated by air. An output coaxial waveguide may be configured to concurrently combine amplified signals from the output antenna structure. Each signal path may further comprise an input antenna structure comprising an input antenna ground conductor and an input antenna signal conductor that are entirely separated by air. An input coaxial waveguide may be configured to provide a signal concurrently to each input antenna structure. The plurality of signal paths may be arranged coaxially about a center axis. Accordingly, the spatial power-combining device may be configured to split, amplify, and combine an electromagnetic signal. Separating the antenna ground conductors and the antenna signal conductors by air eliminates any lossy materials of conventional antenna structures on printed circuit boards and facilitates spatial power-combining devices with antenna structures sized for ultra-broadband microwave operation.

FIG. 1A is a perspective view of a spatial power-combining device 10 according to some embodiments. The spatial power-combining device 10 includes an input port 12, an input coaxial waveguide section 14, a center waveguide section 16, a center waveguide section cover 18, an output coaxial waveguide section 20, and an output port 22.

The input port 12 and the output port 22 may comprise field-replaceable Subminiature A (SMA) connectors. In other embodiments, the input port 12 or the output port 22 may comprise at least one of a super SMA connector, a type N connector, a type K connector, a WR28 connector, other coaxial to waveguide transition connectors, or any other suitable coaxial or waveguide connectors. The input coaxial waveguide section 14 provides a broadband transition from the input port 12 to the center waveguide section 16. Electrically, the input coaxial waveguide section 14 provides broadband impedance matching from an impedance $Z_{p1}$ of the input port 12 to an impedance 4 of the center waveguide section 16. In a similar manner, the output coaxial waveguide section 20 provides broadband impedance matching from the impedance 4 of the center waveguide section 16 to an impedance $Z_{p2}$ of the output port 22.

Figure 1B:
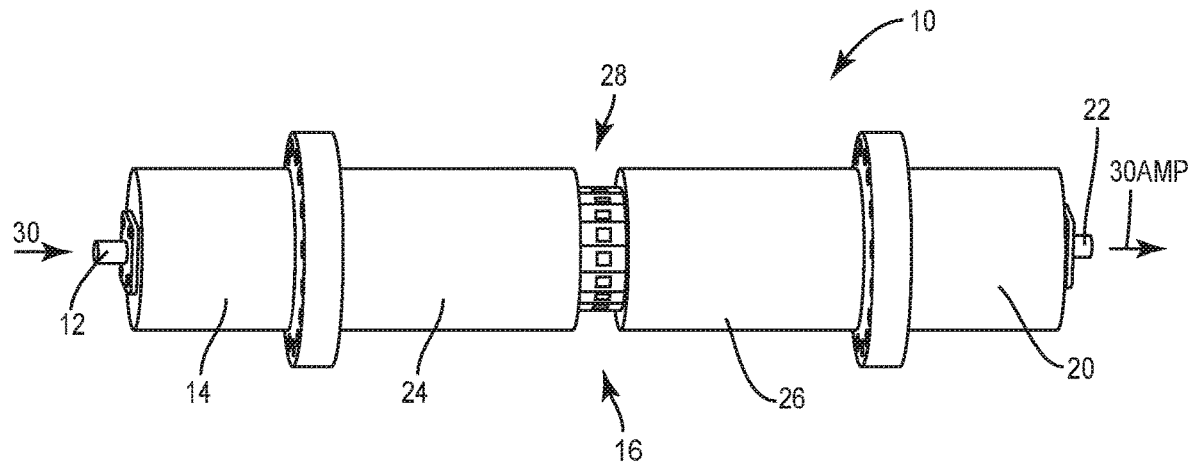
FIG. 1B is a perspective view of the spatial power-combining device of FIG. 1A with the center waveguide section cover removed.

FIG. 1B is a perspective view of the spatial power-combining device 10 of FIG. 1A with the center waveguide section cover 18 removed. As illustrated, the center waveguide section 16 includes an input center waveguide section 24 and an output center waveguide section 26. A plurality of amplifiers 28 are located between the input center waveguide section 24 and the output center waveguide section 26. In operation, an input signal 30 is presented to the input port 12 and transmitted through the input coaxial waveguide section 14 to the input center waveguide section 24. The input center waveguide section 24 is configured to provide the input signal 30 concurrently to each amplifier of the plurality of amplifiers 28 for amplification. The plurality of amplifiers 28 transmit amplified signals portion to the output center waveguide section 26 and the output coaxial waveguide section 20 that operate to combine the amplified signal portions to form an amplified output signal $30_{AMP}$, which is then propagated to the output port 22.

In some embodiments, the plurality of amplifiers 28 comprise an array of Monolithic Microwave Integrated Circuit (MMIC) amplifiers. In some embodiments, each MMIC may include a solid-state Gallium Nitride (GaN)-based MMIC. A GaN MMIC device provides high power density and bandwidth, and a spatial power-combining device may combine power from an array of GaN MMICs efficiently in a single step to minimize combining loss.

Figure 2A:
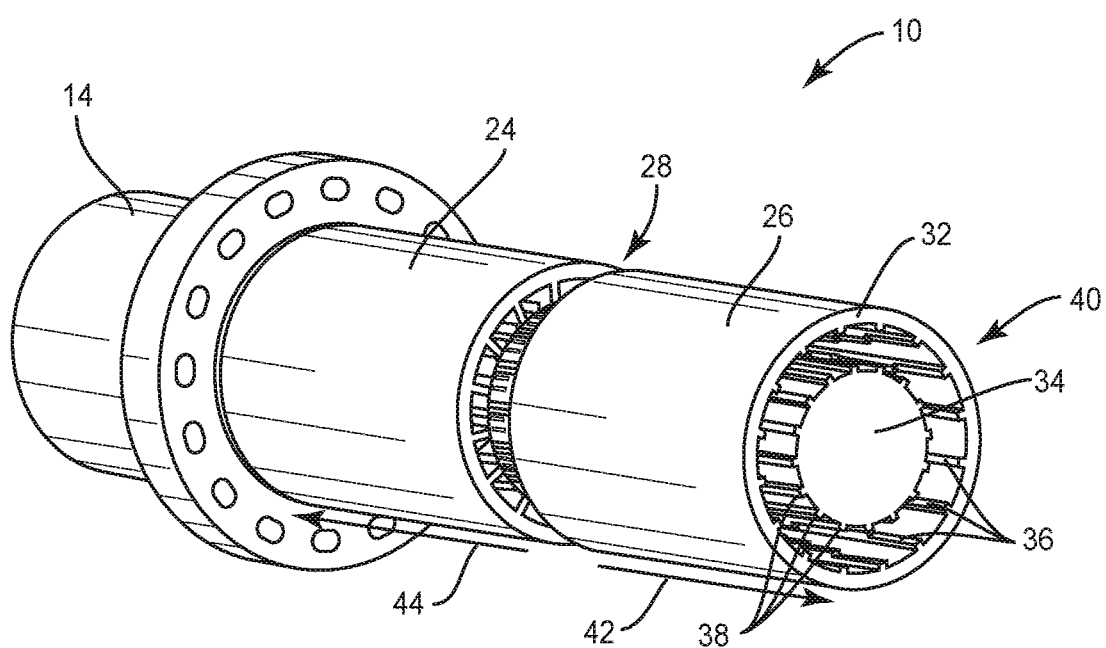
FIG. 2A is a partial perspective view of the spatial power-combining device of FIG. 1B with the output coaxial waveguide section and the output port removed.

FIG. 2A is a partial perspective view of the spatial power-combining device 10 of FIG. 1B with the output coaxial waveguide section 20 and the output port 22 removed. The output center waveguide section 26 comprises an output outer housing 32 and an output inner housing 34. The output outer housing 32 comprises a plurality of output ground conductors 36, and the output inner housing 34 comprises a plurality of output signal conductors 38. The combination of the plurality of output signal conductors 38 and the plurality of output ground conductors 36 form an output antenna assembly 40. As will later be illustrated in more detail, the plurality of output ground conductors 36 and the plurality of output signal conductors 38 diverge away from each other in a first direction 42 from the plurality of amplifiers 28. In some embodiments, the configuration of the input center waveguide section 24 would mirror the output center waveguide section 26, extending in a second direction 44 from the plurality of amplifiers 28 opposite the first direction 42 and toward the input coaxial waveguide section 14; accordingly, the elements would be renamed by replacing the term "output" with the term "input."

Figure 2B:
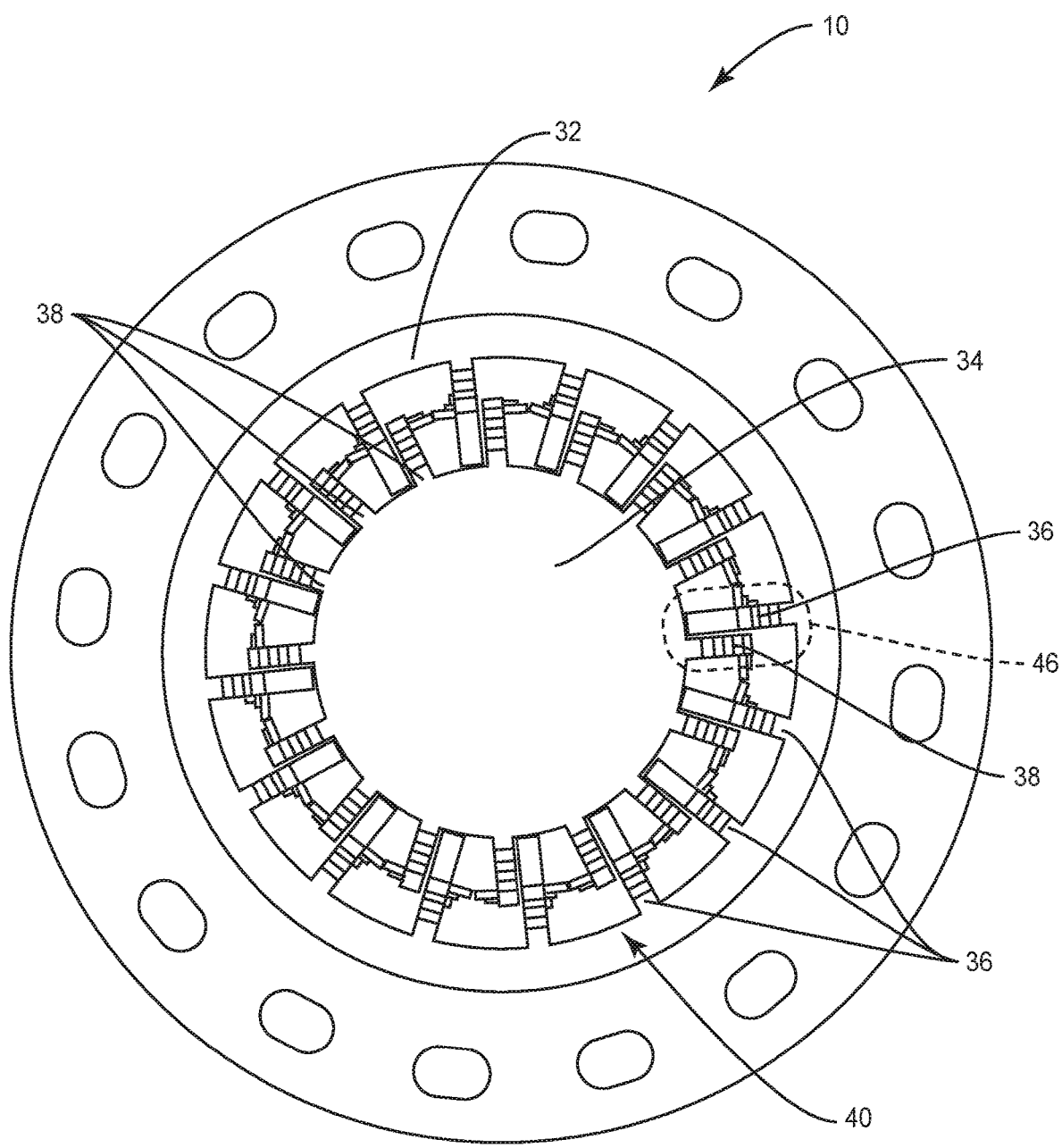
FIG. 2B is a partial end view of the spatial power-combining device of FIG. 2A.

FIG. 2B is a partial end view of the spatial power-combining device 10 of FIG. 2A. The output antenna assembly 40 forms a plurality of output antennas 46 where each output antenna 46 comprises an output signal conductor 38 of the plurality of output signal conductors 38 and an output ground conductor 36 of the plurality of output ground conductors 36. Each output antenna 46 is electromagnetically connected with a corresponding amplifier of the plurality of amplifiers (28 in FIG. 2A). The plurality of output ground conductors 36 are mechanically supported to the output outer housing 32, and the plurality of output signal conductors 38 are mechanically supported to the output inner housing 34. This allows each output antenna 46 to include an output ground conductor 36 and an output signal conductor 38 that are entirely separated by air. This may be accomplished by forming the plurality of output signal conductors 38 and the plurality of output ground conductors 36 with metal that is thick enough to not require a supporting substrate, such as a printed circuit board. In some embodiments, the metal may comprise a same metal as the output inner housing 34 and the output outer housing 32. The metal may comprise many different metals, including for example, Aluminum (Al) or alloys thereof, or Copper (Cu) or alloys thereof. Accordingly, the lossy materials of conventional antenna structures on printed circuit boards are eliminated. This also provides the ability to scale up antenna configurations for lower frequency ranges or scale down antenna configurations for higher frequency ranges not previously attainable. Among other advantages, a spatial power-combining device may include antenna structures sized for ultra-broadband microwave operation.

In some embodiments, the output ground conductors 36 and the output outer housing 32 are an integral single component, and the output signal conductors 38 and the output inner housing 34 are an integral single component. In other embodiments, the output ground conductors 36 and the output signal conductors 38 may be formed separately and attached to the output outer housing 32 and the output inner housing 34, respectively. In other embodiments, the order may be reversed in which the output outer housing 32 comprises output signal conductors and the output inner housing 34 comprises output ground conductors. As with FIG. 2A, it is understood the description of FIG. 2B would applicable for the input center waveguide section (24 in FIG. 2A) in some embodiments; accordingly, the elements would be renamed by replacing the term "output" with the term "input."

Figure 3A:
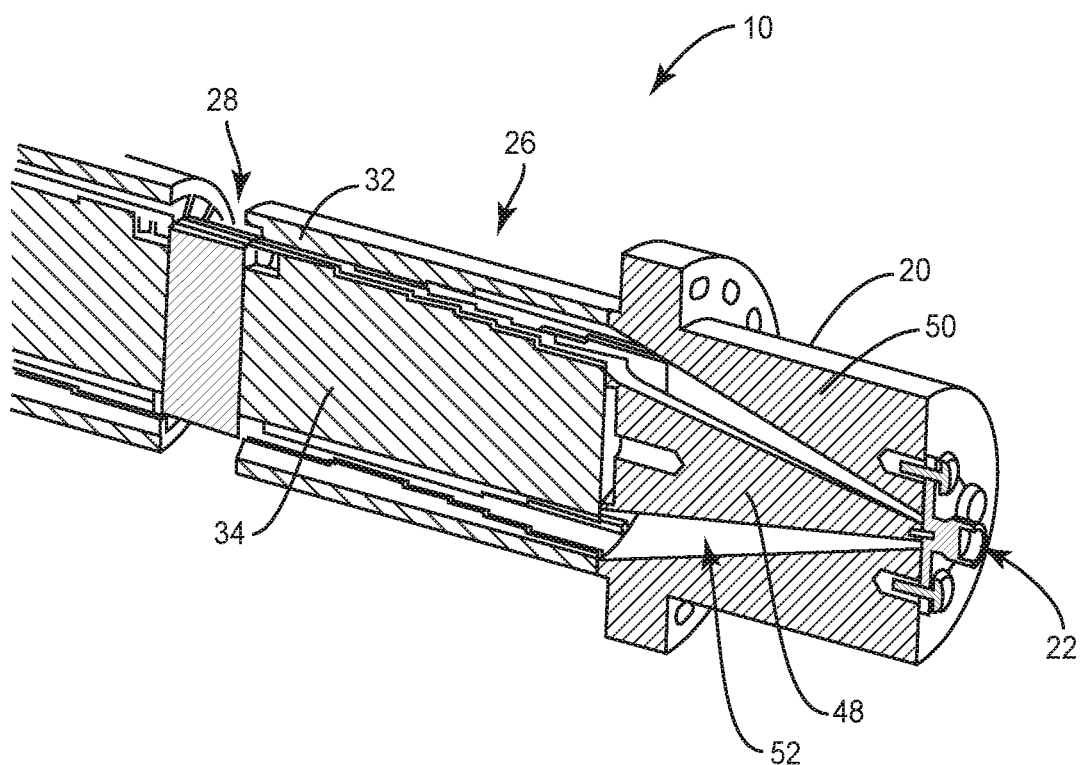
FIG. 3A is a partial cross-sectional view of the spatial power-combining device of FIG. 2A including the plurality of amplifiers, the output center waveguide section, the output coaxial waveguide section, and the output port.

FIG. 3A is a partial cross-sectional view of the spatial power-combining device 10 of FIG. 2A including the plurality of amplifiers 28, the output center waveguide section 26, the output coaxial waveguide section 20, and the output port 22. The output coaxial waveguide section 20 comprises an output inner conductor 48 and an output outer conductor 50 with gradually changing profiles configured to reduce impedance mismatch from the output port 22 and the output center waveguide section 26. An opening 52 is formed between the output inner conductor 48 and the output outer conductor 50 comprising a conical shape. At least a portion of the output inner conductor 48 is in alignment with the output inner housing 34, and at least a portion of the output outer conductor 50 is in alignment with the output outer housing 32.

Figure 3B:
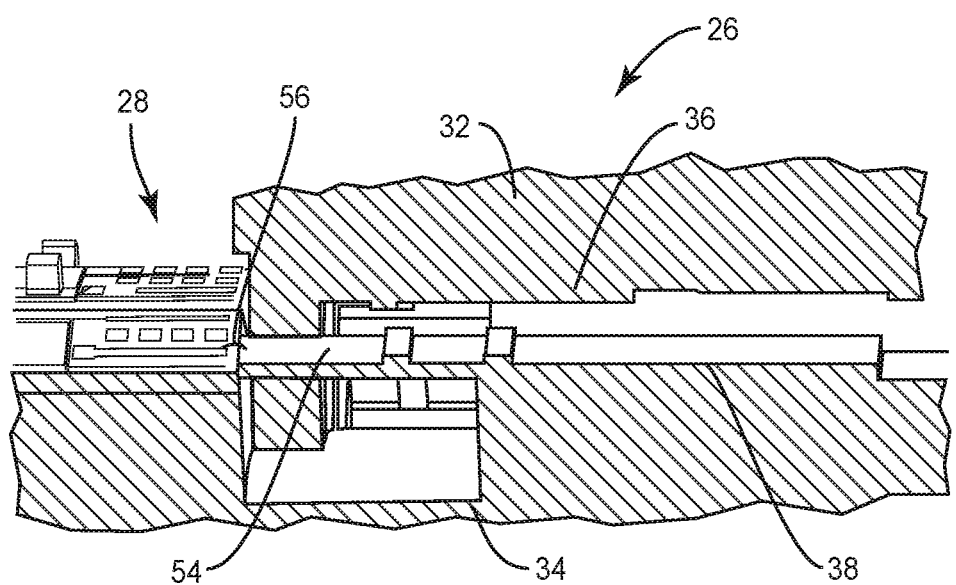
FIG. 3B is a close-up view of a transition between the output center waveguide section and the plurality of amplifiers of the spatial power-combining device of FIG. 3A.

FIG. 3B is a close-up view of a transition between the output center waveguide section 26 and the plurality of amplifiers 28 of the spatial power-combining device 10 of FIG. 3A. An output signal conductor 38 of the output inner housing 34 comprises a connector 54 for making an electrical connection 56 to a corresponding amplifier 28 of the plurality of amplifiers 28. In some embodiments, the connector 54 is an integral single component with the output signal conductor 38 and the output inner housing 34. The electrical connection 56 may comprise a transmission line including a wire, a wire bond, or any other component that functions to transition energy from a planar medium of the corresponding amplifier 28 to an orthogonal direction of the output signal conductor 38 and the output ground conductor 36. Only a portion of the output outer housing 32 and the output inner housing 34 are illustrated. As before, it is understood that in some embodiments, the details of the input side of the device 10 are the same as those of the output side extending in an opposite direction (44 of FIG. 2A) from the plurality of amplifiers 28. Accordingly, a second transmission line may connect between an input signal conductor and the corresponding amplifier 28 of the plurality of amplifiers 28.

In some embodiments, a spatial power-combining device includes an input port, an input coaxial waveguide section, an input center waveguide section, an input antenna assembly, an output center waveguide section, an output antenna assembly, an output coaxial waveguide section, and an output port that are all formed completely of metal, such as Al or alloys thereof, or Cu or alloys thereof. In this manner, the entire structure that an electromagnetic signal passes through before and after amplification is metal. Accordingly, losses associated with conventional antenna structures that use printed circuit boards are eliminated. This allows spatial power-combining devices with higher frequency ranges of operation.

An all-metal configuration further provides the ability to scale the dimensions down for higher frequency ranges or scale the dimensions up for lower frequency ranges. For example, for a lower frequency range of about 350 MHz to about 1100 MHz, a spatial power-combining device may comprise a length of about 50 inches from an input port to an output port and a diameter of a center waveguide section of about 20 inches. For a medium frequency range of about 2 GHz to about 20 GHz, a spatial power-combining device may be scaled to comprise a length of about 9 inches from an input port to an output port and a diameter of a center waveguide section of about 2.3 inches. For a high frequency range of about 20 GHz to about 120 GHz, a spatial power-combining device may be scaled to comprise a length of about 0.75 inches from an input port to an output port and a diameter of a center waveguide section of about 0.325 inches. For an ultra-high frequency range of about 70 GHz to about 400 GHz, a spatial power-combining device may be scaled to comprise a length of about 0.250 inches from an input port to an output port and a diameter of a center waveguide section of about 0.1 inches. Accordingly, a spatial power-combining device may comprise the same structure, only with relative dimensions scaled up or down, and achieve any of the above frequency ranges.

In some embodiments, spatial power-combining devices may include a modular waveguide and/or a modular antenna. As used herein, the term "modular" refers to a structure that is formed by more than one individual module, or segment. For example, a modular waveguide may include a plurality of waveguide modules or segments that collectively form the modular waveguide. Likewise, a modular antenna may include a plurality of antenna modules or segments that collectively form the modular antenna. In some embodiments, a modular waveguide or a modular antenna may be referred to as a segmented waveguide or a segmented antenna, respectively.

FIGS. 4A-4B, FIGS. 5A-5B, and FIGS. 6A-6D are various perspective views of either an input center waveguide section or an output center waveguide section that is modular. For brevity, these figures will be described with respect to an output center waveguide section; however, it is understood the same description could also apply to an input center waveguide section by replacing the term "output" with the term "input."

Figure 4A:
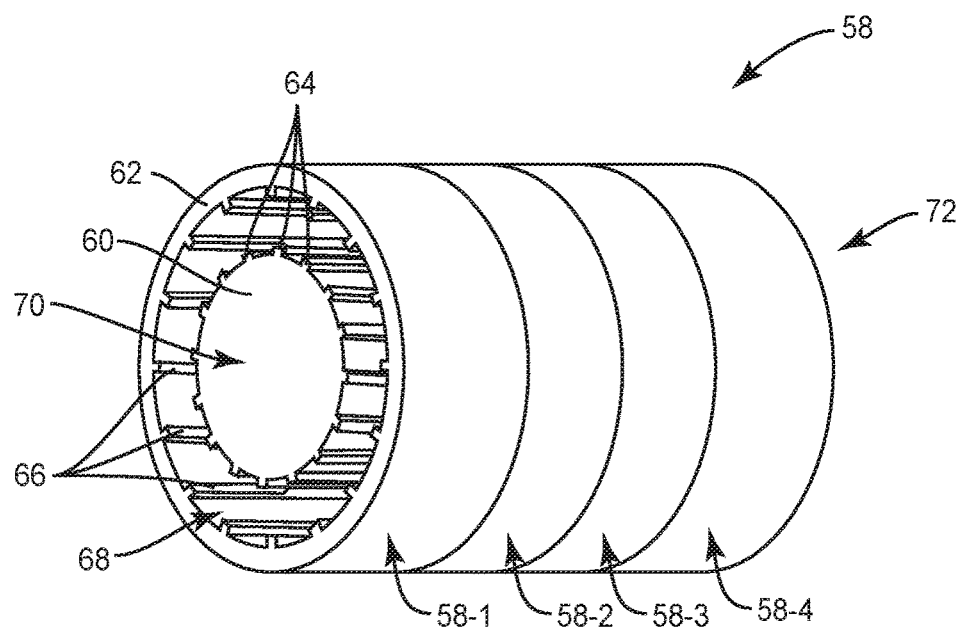
FIG. 4A is a perspective view of an output center waveguide section.

FIG. 4A is a perspective view of an output center waveguide section 58. The output center waveguide section 58 includes an output inner housing 60 and an output outer housing 62 that surrounds the output inner housing 60. The output inner housing 60 includes a plurality of output signal conductors 64, and the output outer housing 62 includes a plurality of output ground conductors 66. The plurality of output ground conductors 66 extend from the output outer housing 62 toward the output inner housing 60 in an alternating arrangement with the plurality of output signal conductors 64 that extend from the output inner housing 60 toward the output outer housing 62. In this manner, the plurality of output ground conductors 66 and the plurality of output signal conductors 64 form an output antenna assembly 68. A first end 70 of the output center waveguide section 58 is configured to be arranged closest to an output coaxial waveguide section (e.g. 20 of FIG. 3A) in a spatial power-combining device. A second end 72 of the output center waveguide section 58 is configured to be arranged closest to a plurality of amplifiers (e.g. 28 of FIG. 3A). In this manner, the output antenna assembly 68 is configured to guide amplified signals from the amplifiers to the output coaxial waveguide section of a spatial power-combining device. In FIG. 4A, the output center waveguide section 58 includes a plurality of output center waveguide segments 58-1 to 58-4. In some embodiments, the plurality of output center waveguide segments 58-1 to 58-4 are discontinuous with each other and collectively form the output center waveguide section 58 when assembled. Each output center waveguide segment 58-1 to 58-4 includes a different portion of the output inner housing 60 and a different portion of the output outer housing 62; and a different portion of the plurality of output ground conductors 66 and a different portion of the plurality of output signal conductors 64.

Figure 4B:
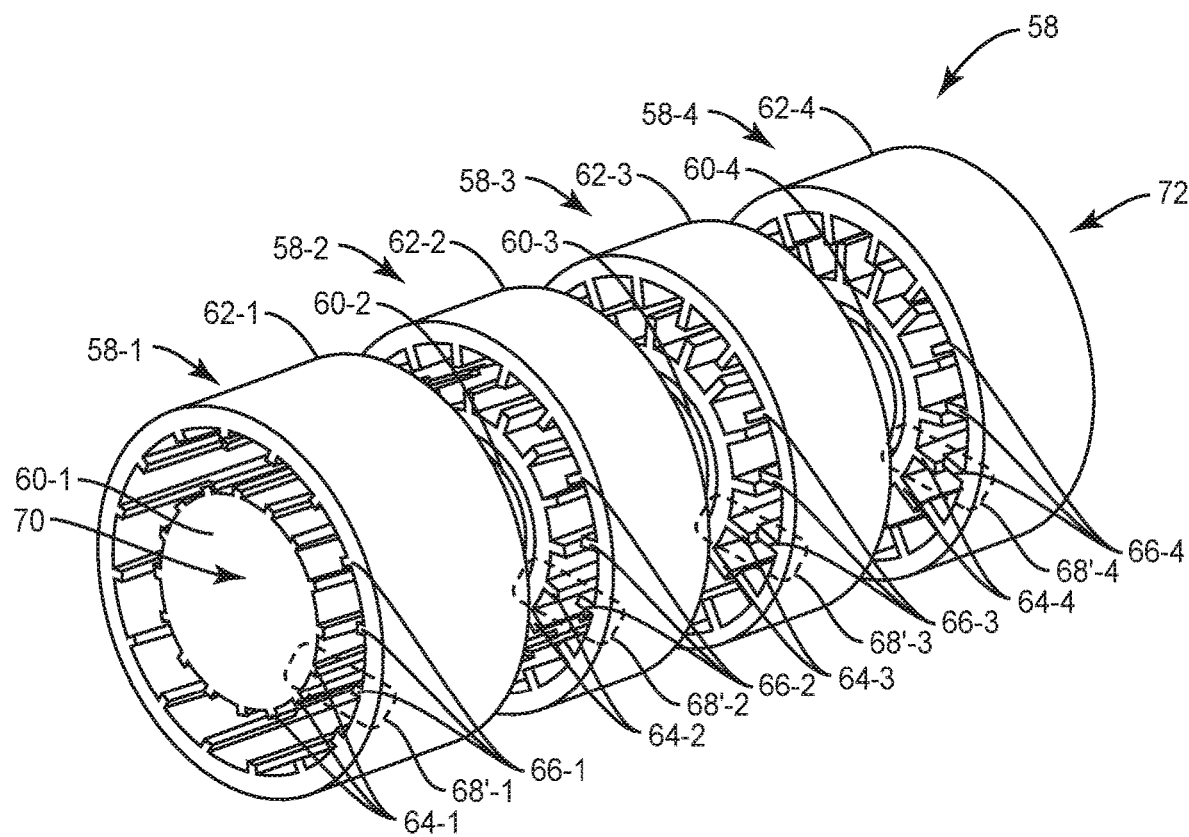
FIG. 4B is an exploded perspective view of the output center waveguide section of FIG. 4A where the plurality of output center waveguide segments are spaced apart from each other.

FIG. 4B is an exploded perspective view of the output center waveguide section 58 of FIG. 4A where the plurality of output center waveguide segments 58-1 to 58-4 are spaced apart from each other. As illustrated, the discontinuous nature of the plurality of output center waveguide segments 58-1 to 58-4 forms a plurality of output inner housing segments 60-1 to 60-4 and a plurality of output outer housing segments 62-1 to 62-4. In a similar manner, the output center waveguide section 58 comprises a plurality of output ground conductor segments 66-1 to 66-4 and a plurality of output signal conductor segments 64-1 to 64-4 that diverge away from each other from the second end 72 to the first end 70. For example, the plurality of output ground conductor segments 66-4 and the plurality of output signal conductor segments 64-4 are closer to each other in the output center waveguide segment 58-4 than the plurality of output ground conductor segments 66-1 and the plurality of output signal conductor segments 64-1 in the output center waveguide segment 58-1. Accordingly, the second end 72 is configured to receive amplified signals and guide them to the output coaxial waveguide section (e.g. 20 of FIG. 3A) where they may be combined into an amplified output signal.

The plurality of output ground conductor segments 66-1 to 66-4 collectively form the plurality of output ground conductors (66 of FIG. 4A) and the plurality of output signal conductor segments 64-1 to 64-4 collectively form the plurality of output signal conductors (64 of FIG. 4A). An individual output antenna of the output antenna assembly (68 of FIG. 4A) may be defined as an individual pair of an output ground conductor of the plurality of output ground conductors (66 of FIG. 4A) and an output signal conductor of the plurality of output signal conductors (64 of FIG. 4A). In FIG. 4B, dashed lines indicate the position of a plurality of output antenna segments 68'-1 to 68'-4 that are discontinuous with each other and collectively form an individual output antenna when assembled. Each of the plurality of output antenna segments 68'-1 to 68'-4 includes a different output signal conductor segment 64-1 to 64-4 and a different output ground conductor segment 66-1 to 66-4, respectively. Stated differently, each of the plurality of output antenna segments 68'-1 to 68'-4 includes a different portion of an individual output signal conductor (64 of FIG. 4A) and a different portion of an individual output ground conductor (66 of FIG. 4A). In the output antenna segment 68'-1, the output ground conductor segment 66-1 is spaced farther apart from the output signal conductor segment 64-1 than the output ground conductor segments 66-2 to 66-4 and the output signal conductor segments 64-2 to 64-4 in the other antenna segments 68'-2 to 68'-4. In some embodiments, the plurality of output antenna segments 68'-1 to 68'-4 are formed completely of metal, such as Al or alloys thereof, or Cu or alloys thereof. In further embodiments, the output signal conductor segments 64-1 to 64-4 and the output ground conductor segments 66-1 to 66-4 are entirely separated by air.

In this manner, a spatial power-combining device may include a modular or a segmented output center waveguide. For example, a spatial power-combining device may include a plurality of amplifiers, an output center waveguide section configured to concurrently receive amplified signals from the plurality of amplifiers, and an output coaxial waveguide section configured to receive the amplified signals from the output center waveguide section. The output center waveguide section may include an output inner housing and an output outer housing. Additionally, the output center waveguide section may form a plurality of output center waveguide segments that are discontinuous with each other, and each output center waveguide segment of the plurality of output center waveguide segments includes a different portion of the output inner housing and a different portion of the output outer housing. In a similar manner, the spatial power-combining device may additionally include a modular or segmented input center waveguide.

In some embodiments, a spatial power-combining device with a modular input center waveguide or a modular output center waveguide is configured to be a tunable spatial power-combining device. As previously described, individual segments of the input or output center waveguide sections include different portions of the plurality of input or output signal conductors and different portions of the plurality of input or output ground conductors. Accordingly, each individual segment of the input center waveguide section includes a different portion of the input antenna assembly, and each individual segment of the output center waveguide section includes a different portion of the output antenna assembly. In operation, the performance of a spatial power-combining device may be measured and subsequently tuned or adjusted by replacing an individual segment of either the input center waveguide section or the output center waveguide section. As will be later described in more detail, antenna assemblies for spatial power-combining devices include different shapes, tapering profiles, and tuning features that are configured to achieve a targeted frequency response. If a modular spatial power-combining device does not meet the targeted frequency response, one or more individual segments of either the input center waveguide section or the output center waveguide section may be replaced with a different segment that includes a different shape, profile, or tuning features that allows the device to achieve the targeted frequency response.

Figure 5A:
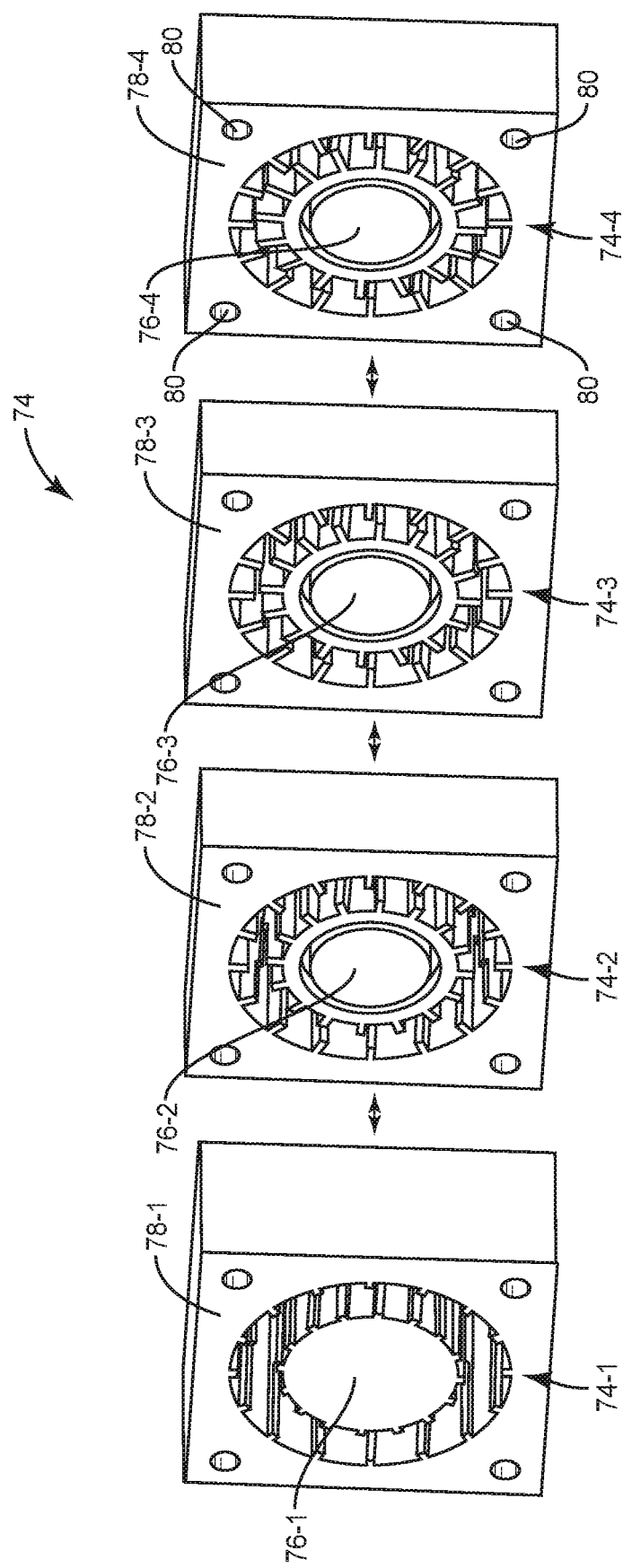
FIG. 5A is an exploded perspective view of an output center waveguide section according to some embodiments.
Figure 5B:
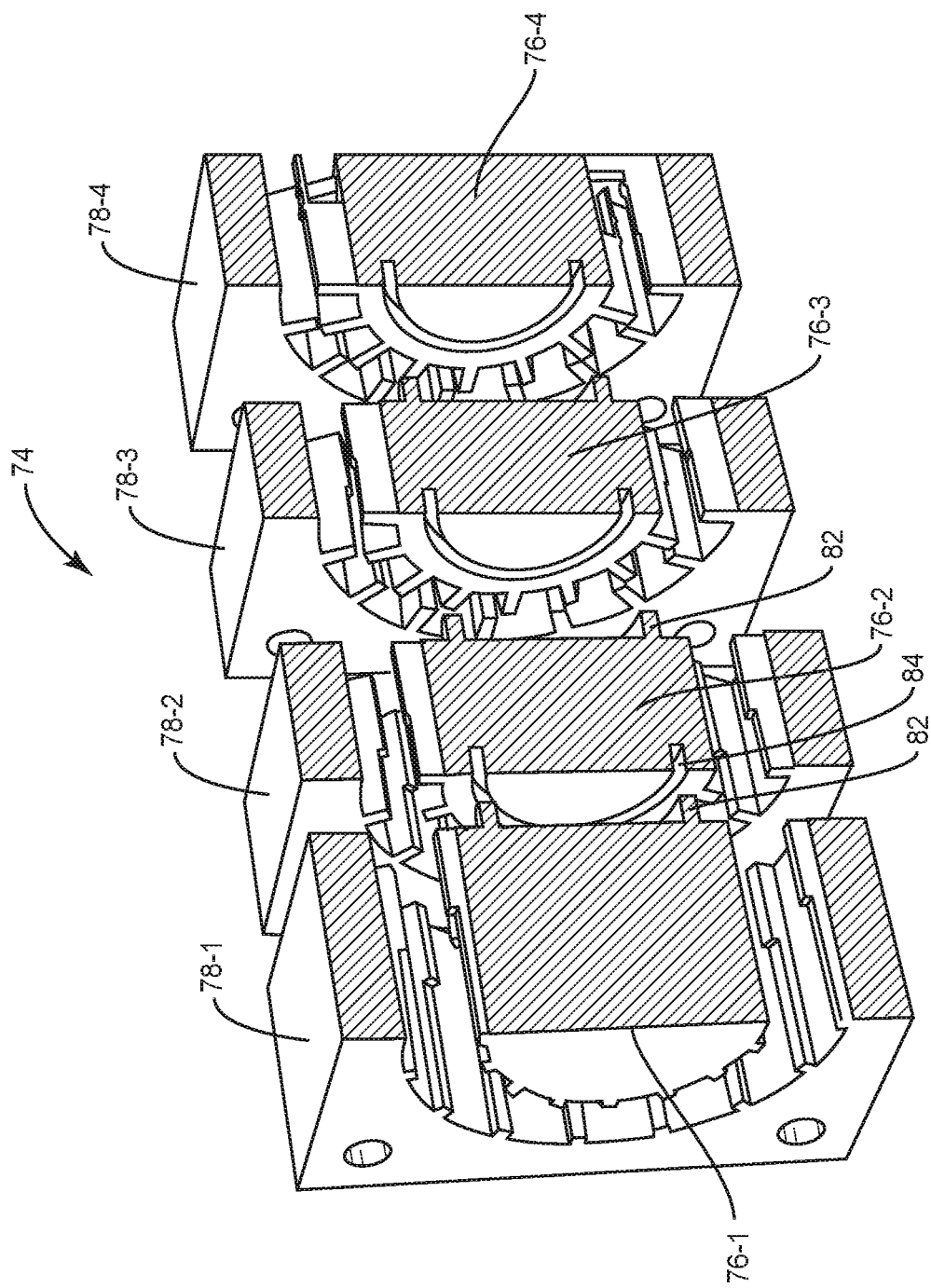
FIG. 5B is an exploded perspective view of a cross-section of the output center waveguide section of FIG. 5A according to some embodiments.

FIG. 5A is an exploded perspective view of an output center waveguide section 74 according to some embodiments. The output center waveguide section 74 includes a plurality of output center waveguide segments 74-1 to 74-4 that are discontinuous with each other and form a plurality of output inner housing segments 76-1 to 76-4 and a plurality of output outer housing segments 78-1 to 78-4. In some embodiments, the output center waveguide section 74 is modular in that the plurality of output center waveguide segments 74-1 to 74-4 are removably-attached to each other. For example, the plurality of output outer housing segments 78-1 to 78-4 may be mechanically attached to one another with bolts or screws through a plurality of holes 80, although other forms of mechanical attachment are possible. FIG. 5B is an exploded perspective view of a cross-section of the output center waveguide section 74 of FIG. 5A according to some embodiments. In FIG. 5B, the plurality of output inner housing segments 76-1 to 76-4 are mechanically attached to each other. For example, the output inner housing segment 76-1 includes a protrusion 82 and the output inner housing segment 76-2 includes a recess 84 for receiving the protrusion 82. In some embodiments, the protrusion 82 is mechanically attached to the recess 84 with a press-fit connection. In other embodiments, the protrusion 82 may be screwed into the recess 84 by threaded surfaces, although other attachment mechanisms are possible. In FIG. 5B, the protrusion 82 and the recess 84 are illustrated as circular, or half-circular in cross-section. In other embodiments, the output inner housing segment 76-1 may include a plurality of protrusions 82, and the output inner housing segment 76-2 may include a plurality of corresponding recesses 84. Notably, the output inner housing segments 76-2, 76-3 that are in the middle of the output center waveguide section 74 may include both a protrusion 82 and a recess 84. In some embodiments, the plurality of output outer housing segments 78-1 to 78-4 are mechanically attached to each other in a separate manner than the plurality of output inner housing segments 76-1 to 76-4.

Figure 6A:
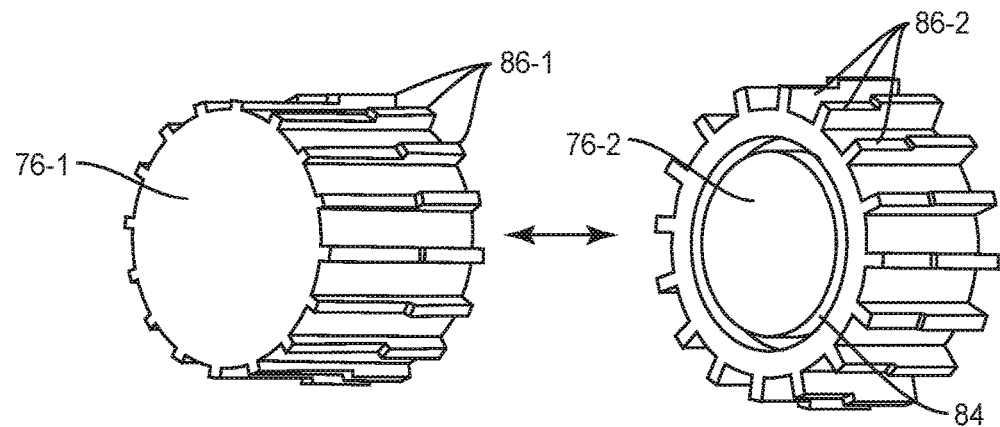
FIG. 6A is an exploded perspective view of the output inner housing segments of FIG. 5A.
Figure 6B:
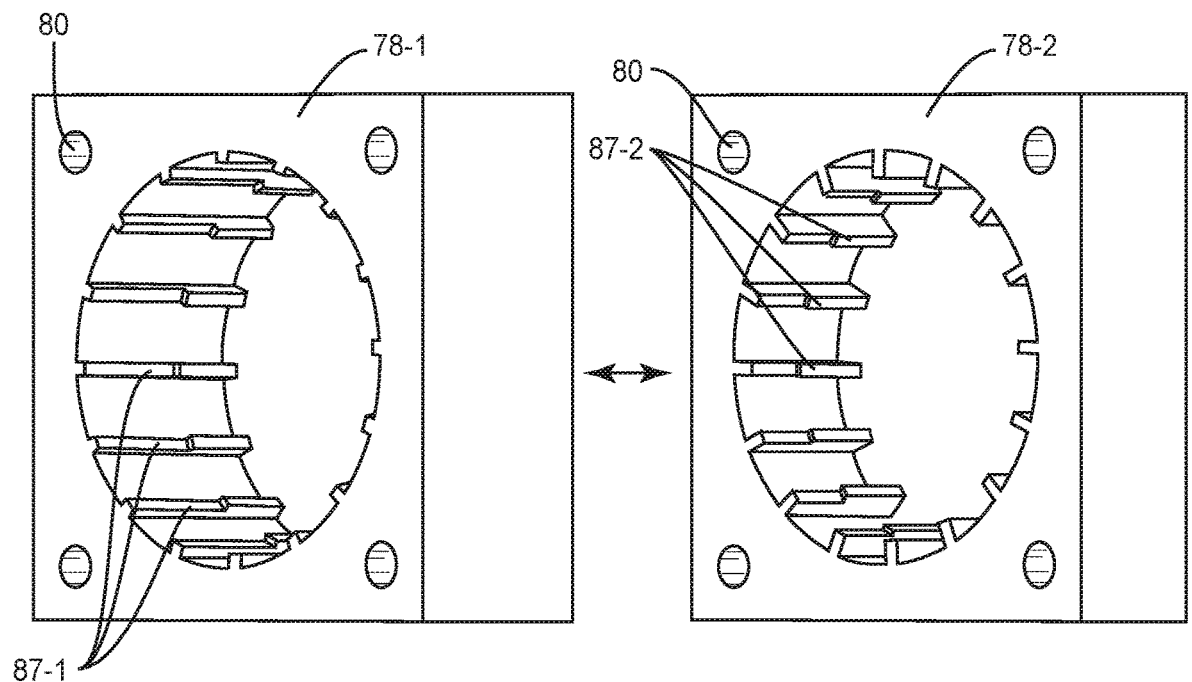
FIG. 6B is an exploded perspective view of the output outer housing segments of FIG. 5A.

FIG. 6A is an exploded perspective view of the output inner housing segments 76-1 and 76-2 of FIG. 5A. The output inner housing segment 76-1 includes a plurality of output signal conductor segments 86-1, and the output inner housing segment 76-2 includes a plurality of output signal conductor segments 86-2. After assembly, the output inner housing segment 76-1 is mechanically attached to the output inner housing segment 76-2 in the recess 84 such that the output signal conductor segments 86-1 and 86-2 are in alignment with each other. FIG. 6B is an exploded perspective view of the output outer housing segments 78-1 and 78-2 of FIG. 5A. The output outer housing segment 78-1 includes a plurality of output ground conductor segments 87-1, and the output outer housing segment 78-2 includes a plurality of output ground conductor segments 87-2. After assembly, the output ground conductor segments 87-1 and 87-2 are in alignment with each other. As previously described, the output outer housing segments 78-1 and 78-2 may be mechanically attached to one another with bolts or screws through the plurality of holes 80, although other forms of mechanical attachment are possible. Notably, the output outer housing segments 78-1 and 78-2 may be mechanically attached to one another separately from the mechanical attachment of the output inner housing segments 76-1 and 76-2 (of FIG. 6B).

As previously described, a spatial power-combining device with an all-metal design allows scalability for higher or lower frequency ranges that were not previously possible with conventional antenna structures. For example, for frequencies above about 20 GHz, the dimensional requirements of an individual antenna may be so small that they fall below minimum thickness limitations for printed circuit boards. Additionally, for frequencies below 1 or 2 GHz, the dimensional requirements of an individual antenna become larger than conventional antenna arrangements on printed circuit boards. An all-metal antenna allows flexibility to design spatial power-combining devices for a wide range of operation frequencies.

FIG. 7A is a perspective view of an antenna structure 88 according to some embodiments. The antenna structure 88 includes a signal conductor 90 with a first profile 90P and a ground conductor 92 with a second profile 92P that diverge away from each other along parallel planes in a lengthwise direction. The signal conductor 90 and the ground conductor 92 may additionally include tuning features 94 configured for a desired operating frequency and an operating bandwidth. In FIG. 7A, the tuning features 94 are configured in a continuously decreasing stepwise manner as the signal conductor 90 and the ground conductor 92 diverge away from each other. Accordingly, the first profile 90P and the second profile 92P may diverge from one another in a stepwise manner. However, many different profiles are possible depending on the desired frequency and bandwidth operation. For example, the tuning features 94 may comprise steps that increase and decrease at various points along the first profile 90P and the second profile 92P. Additionally, the first profile 90P and the second profile 92P may diverge from one another in a continuous manner without steps. The antenna structure 88 may be incorporated into any of the previously described spatial power-combining devices. Accordingly, the antenna structure 88 may be divided into a plurality of antenna segments that after assembly, form the first profile 90P and the second profile 92P. In some embodiments, each antenna segment includes tuning features and in further embodiments, the size and/or shape of tuning features may differ between antenna segments.

As in previous embodiments, the signal conductor 90 may additionally include a connector 96 for transmitting or receiving a signal to or from an amplifier. The connector 96 may be a single piece or integral with the signal conductor 90, or it may be formed separately. The connector 96 is a transition area for the antenna structure 88 to transmit or receive a signal, such as a signal with a frequency in the microwave range or higher. The antenna structure 88 may comprise a metal with a thickness such that a substrate is not required for support, thereby an air gap 98 is maintained entirely between the signal conductor 90 and the ground conductor 92. Accordingly, the signal conductor 90 and the ground conductor 92 are entirely separated by air.

FIGS. 7B, 7C, and 7D represent various cross-sections taken along section lines I-I, II-II, and III-III, respectively, of the antenna structure 88 of FIG. 7A in which the ground conductor 92 and the signal conductor 90 diverge away from each other along a lengthwise direction. As shown, the ground conductor 92 is a planar structure positioned in a first plane P1, and the signal conductor 90 is a planar structure positioned in a second plane P2, and the first plane P1 is parallel to the second plane P2. The ground conductor 92 comprises a ground conductor overlapping portion 100 and a ground conductor non-overlapping portion 102. The signal conductor 90 comprises a signal conductor overlapping portion 104 and a signal conductor non-overlapping portion 106. In FIG. 7B, a first line 108 perpendicular to the first plane P1 intersects the ground conductor overlapping portion 100 and the signal conductor overlapping portion 104. As the ground conductor 92 and signal conductor 90 diverge away from each other along the lengthwise direction of the antenna structure, there are cross-sections where no line perpendicular to the first plane P1 intersects any portion of both the ground conductor 92 and the signal conductor 90. For example, in the cross-sections of FIGS. 7C and 7D, a second line 110 and a third line 112, respectively, represent perpendicular lines closest to both the ground conductor 92 and the signal conductor 90.

It is understood that the antenna structure 88 of FIGS. 7A to 7D may be configured to comprise an input antenna structure or an output antenna structure as described in previous embodiments. Accordingly, the ground conductor 92 may be configured as an input ground conductor with an input ground conductor overlapping portion and an input ground conductor non-overlapping portion or an output ground conductor with an output ground conductor overlapping portion and an output ground conductor non-overlapping portion. The signal conductor 90 may be configured as an input signal conductor with an input signal conductor overlapping portion and an input signal conductor non-overlapping portion or an output signal conductor with an output signal conductor overlapping portion and an output signal conductor non-overlapping portion.

As previously described, a spatial power-combining device may include an antenna assembly that includes at least one antenna in which a conventional substrate is removed and the signal and ground conductors are separated entirely by air. This configuration provides the ability to scale down designs for higher frequency ranges not previously attainable. For example, an antenna structure 114 of FIG. 8 comprises a signal conductor 116, a ground conductor 118, and tuning features 120 that are scaled to provide an operating range of 20 GHz to 120 GHz. For example, the antenna structure 114 may have a length 114L of about 6-7 millimeters (mm) and a height 114H of about 1-2 mm. In FIG. 9, an antenna structure 122 comprises a signal conductor 124, a ground conductor 126, and tuning features 128 that are scaled down further to provide an operating range of 70 GHz to 400 GHz. For example, the antenna structure 122 may have a length 122L of about 1-2 mm and a height 122H of about 0.3-0.6 mm. In both designs, the impedance along the antenna structure may transform from 50 ohms to 375 ohms. While this scalability is advantageous for high-frequency designs, it is also applicable for lower frequency applications. For example, an antenna structure 130 of FIG. 10 comprises a signal conductor 132, a ground conductor 134, and tuning features 136 that are larger than those in FIG. 8 and FIG. 9 and may be configured for operation below 1 GHz. For example, the antenna structure 130 may have a length 130L of about 610-640 mm and a height 130H of about 150-160 mm. It is understood that the antenna structures 114, 122, and 130 of FIGS. 8, 9, and 10, respectively, may be configured to be input antenna structures or output antenna structures as described in previous embodiments. Accordingly, an output antenna structure or an input antenna structure may be configured to transmit electromagnetic signals in various frequency ranges, including ranges that are below 1 GHz as well as ranges that include frequencies up to about 400 GHz, or higher.

Figure 8:
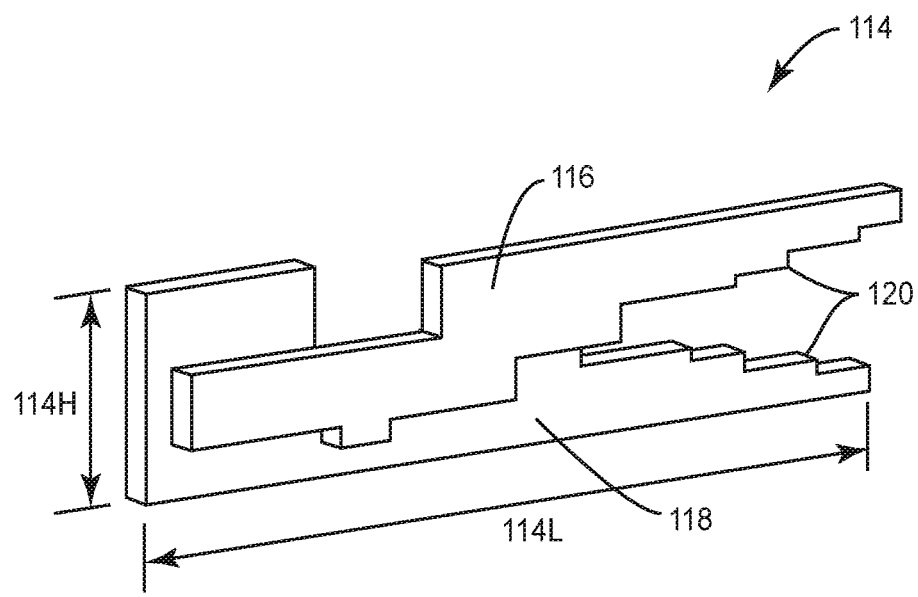
FIG. 8 is a perspective view of an antenna structure according to some embodiments.
Figure 9:
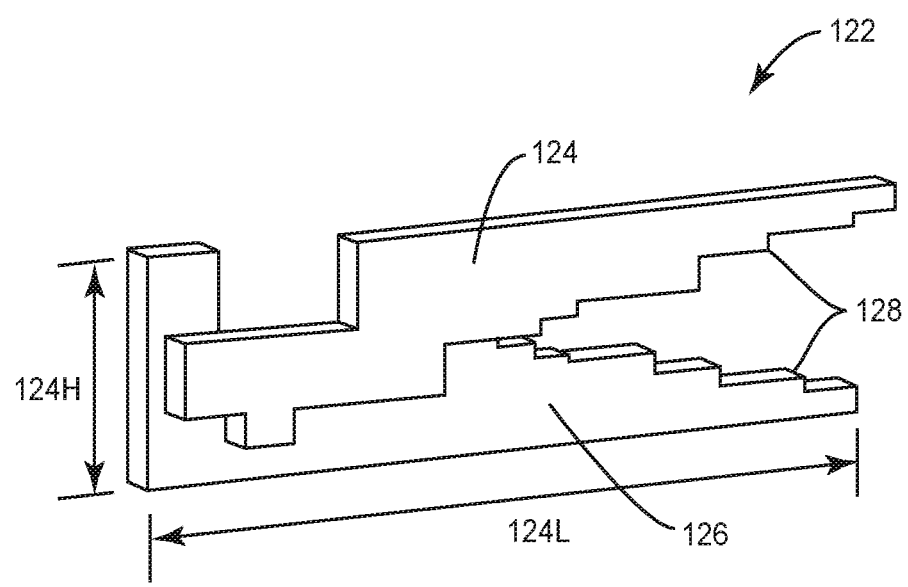
FIG. 9 is a perspective view of an antenna structure according to some embodiments.
Figure 10:
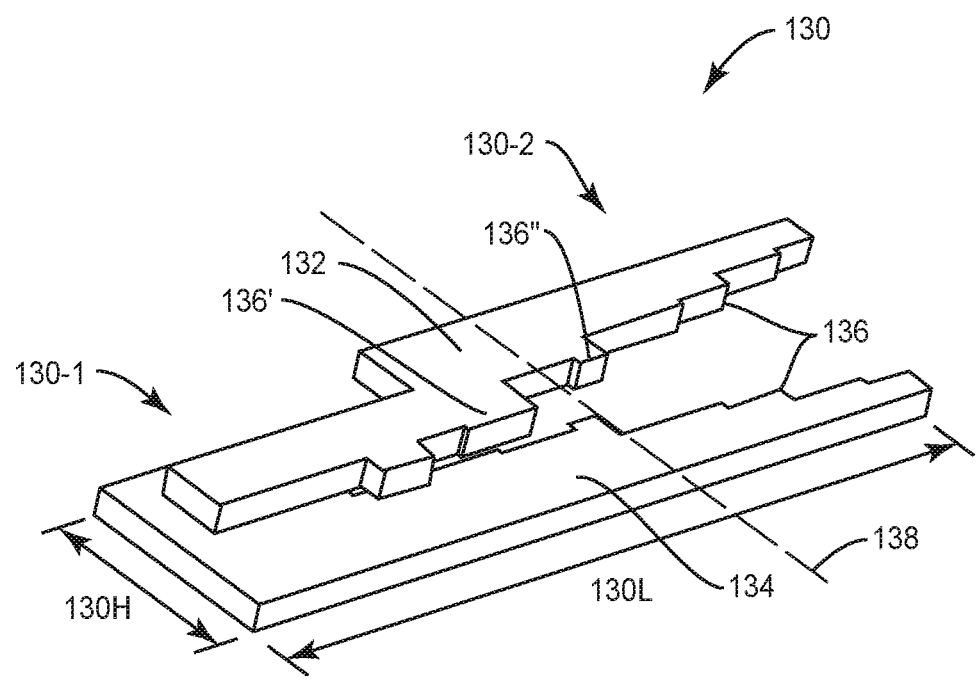
FIG. 10 is a perspective view of an antenna structure according to some embodiments.

The antenna structures 114, 122, and 130 of FIGS. 8, 9, and 10, respectively, may be incorporated into any of the previously described spatial power-combining devices. Accordingly, the antenna structures 114, 122, and 130 may be divided into a plurality of antenna segments that after assembly form the shapes illustrated. For example, in FIG. 10, the antenna structure 130 may comprise a plurality of antenna structure segments 130-1, 130-2 divided along a dashed line 138. In some embodiments, a first antenna structure segment 130-1 includes a first tuning feature 136', and a second antenna structure segment 130-2 includes a second tuning feature 136". In some embodiments, the size and/or shape of the first tuning feature 136' may different than the second tuning feature 136". A modular spatial power-combining device as previously described provides the ability to change the second antenna structure segment 130-2 and the second tuning feature 136" independently of the first antenna structure segment 130-1 and the first tuning feature 136'.

Figure 11:
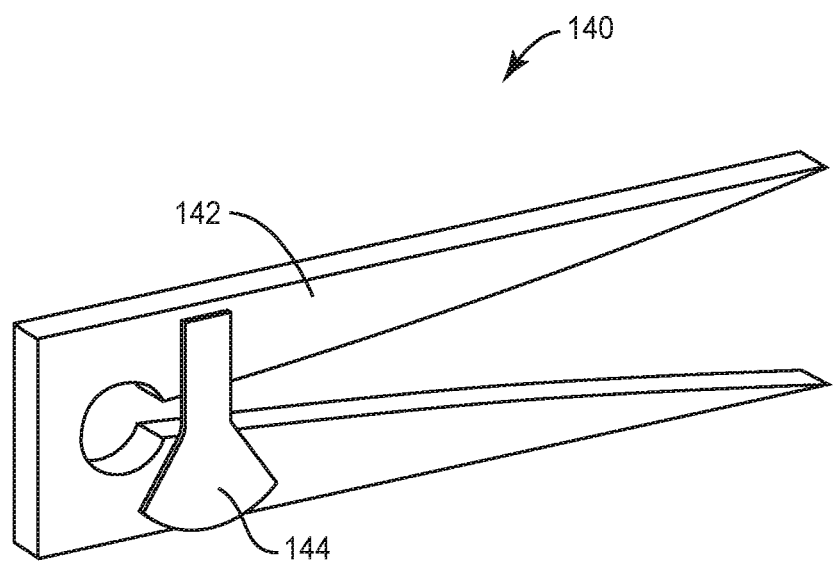
FIG. 11 is a perspective view of an antenna structure according to some embodiments.

Additional antenna designs are possible, such as a stub-launch antenna design, as shown by an antenna structure 140 of FIG. 11. The antenna structure 140 comprises a ground conductor 142 and a signal conductor 144 that are entirely separate by air. The antenna structure 140 is configured of metal thick enough so that a supporting substrate such as a printed circuit board is not required. Accordingly, the antenna structure 140 may comprise a Vivaldi antenna that is free of printed circuit board materials.

In some embodiments, the antenna structures 88, 114, 122, 130 and 140 of FIGS. 7, 8, 9, 10 and 11, respectively, may be configured as input antenna structures or output antenna structures for spatial power-combining devices. Accordingly, the elements would be renamed by adding the term "output" or the term "input."

Those skilled in the art will recognize improvements and modifications to the preferred embodiments of the present disclosure. All such improvements and modifications are considered within the scope of the concepts disclosed herein and the claims that follow.

What is claimed is:

1. A spatial power-combining device comprising:
    a plurality of amplifiers;
    an output center waveguide section configured to concurrently receive amplified signals from the plurality of amplifiers, wherein the output center waveguide section comprises an output inner housing, an output outer housing, and a plurality of output antennas; and
    an output coaxial waveguide section configured to receive the amplified signals from the output center waveguide section;
    wherein the output center waveguide section forms a plurality of output center waveguide segments that are discontinuous with each other, and each output center waveguide segment of the plurality of output center waveguide segments comprises a different portion of the output inner housing, a different portion of the output outer housing, and a different output antenna segment of an individual output antenna of the plurality of output antennas.

2. The spatial power-combining device of claim 1 wherein the output inner housing comprises a plurality of output signal conductors and the output outer housing comprises a plurality of output ground conductors.

3. The spatial power-combining device of claim 2 wherein the plurality of output signal conductors and the plurality of output ground conductors form an output antenna assembly.

4. The spatial power-combining device of claim 2 wherein each output center waveguide segment of the plurality of output center waveguide segments comprises a different portion of the plurality of output ground conductors and a different portion of the plurality of output signal conductors.

5. The spatial power-combining device of claim 1 wherein the output inner housing comprises a plurality of output inner housing segments and the output outer housing comprises a plurality of output outer housing segments.

6. The spatial power-combining device of claim 5 wherein the plurality of output inner housing segments are mechanically attached to each other and the plurality of output outer housing segments are mechanically attached to each other.

7. The spatial power-combining device of claim 1 further comprising:
an input center waveguide section configured to concurrently guide an input signal to the plurality of amplifiers, wherein the input center waveguide section comprises an input inner housing and an input outer housing.

8. The spatial power-combining device of claim 7 wherein the input center waveguide section forms a plurality of input center waveguide segments that are discontinuous with each other, wherein each input center waveguide segment of the plurality of input center waveguide segments comprises a different portion of the input inner housing and a different portion of the input outer housing.

9. The spatial power-combining device of claim 8 further comprising an input coaxial waveguide section configured to guide the input signal to the input center waveguide section.

10. The spatial power-combining device of claim 9 wherein the input center waveguide section and the input coaxial waveguide section are formed completely of metal.

11. The spatial power-combining device of claim 8 wherein the input inner housing comprises a plurality of input signal conductors and the input outer housing comprises a plurality of input ground conductors.

12. The spatial power-combining device of claim 11 wherein each input center waveguide segment of the plurality of input center waveguide segments comprises a different portion of the plurality of input ground conductors and a different portion of the plurality of input signal conductors.

13. The spatial power-combining device of claim 1 wherein the output center waveguide section and the output coaxial waveguide section are formed completely of metal.

14. The spatial power-combining device of claim 1 wherein the plurality of amplifiers comprises a plurality of Monolithic Microwave Integrated Circuit (MMIC) amplifiers.

15. An antenna for a spatial power-combining device, the antenna comprising:
a signal conductor;
a ground conductor; and
a plurality of antenna segments that are discontinuous with each other;
wherein each antenna segment of the plurality of antenna segments comprises a different portion of the signal conductor and a different portion of the ground conductor.

16. The antenna of claim 15 wherein the plurality of antenna segments comprises:
a first antenna segment; and
a second antenna segment;
wherein the signal conductor and the ground conductor are spaced farther apart from each other in the first antenna segment than in the second antenna segment.

17. The antenna of claim 15 wherein the signal conductor and the ground conductor are formed completely of metal.

18. The antenna of claim 15 wherein the signal conductor and the ground conductor are entirely separated by air.

19. The antenna of claim 16 wherein the first antenna segment of the plurality of antenna segments comprises a first tuning feature and the second antenna segment of the plurality of antenna segments comprises a second tuning feature.

20. The antenna of claim 19 wherein the first tuning feature is different than the second tuning feature.

* * * * *

UNITED STATES PATENT AND TRADEMARK OFFICE
CERTIFICATE OF CORRECTION

PATENT NO.       : 10,651,527 B2
APPLICATION NO.  : 15/981535
DATED            : May 12, 2020
INVENTOR(S)      : Ankush Mohan Page 1 of 1

It is certified that error appears in the above-identified patent and that said Letters Patent is hereby corrected as shown below:

In the Specification

In Column 6, Lines 12 and 15, replace "impedance 4" with --impedance $Z_c$--.

Signed and Sealed this
Twenty-third Day of June, 2020

Andrei Iancu
*Director of the United States Patent and Trademark Office*